United States Patent
Orita et al.

(10) Patent No.: US 8,124,477 B2
(45) Date of Patent: Feb. 28, 2012

(54) NON-VOLATILE SEMICONDUCTOR MEMORY DEVICE AND METHOD FOR MANUFACTURING THE SAME

(75) Inventors: Toshiyuki Orita, Miyazaki (JP); Junya Maneki, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 42 days.

(21) Appl. No.: 12/556,642

(22) Filed: Sep. 10, 2009

(65) Prior Publication Data

US 2009/0325351 A1    Dec. 31, 2009

Related U.S. Application Data

(62) Division of application No. 11/585,798, filed on Oct. 25, 2006, now Pat. No. 7,608,887.

(30) Foreign Application Priority Data

Dec. 2, 2005  (JP) .................................. 2005-348838

(51) Int. Cl.
*H01L 21/336* (2006.01)
(52) U.S. Cl. ................................ 438/261; 257/E21.679
(58) Field of Classification Search .................. 438/260, 438/954
See application file for complete search history.

(56) References Cited

U.S. PATENT DOCUMENTS

| | | | |
|---|---|---|---|
| 5,838,041 A * | 11/1998 | Sakagami et al. | ............ 257/324 |
| 6,462,373 B2 | 10/2002 | Shimizu et al. | |
| 6,803,620 B2 | 10/2004 | Moriya et al. | |
| 7,187,594 B2 | 3/2007 | Shibata et al. | |
| 2005/0036366 A1 | 2/2005 | Ono | |

FOREIGN PATENT DOCUMENTS

| JP | 2004342889 A | 12/2004 |
|---|---|---|
| JP | 2005064295 | 3/2005 |

* cited by examiner

*Primary Examiner* — Chandra Chaudhari
(74) *Attorney, Agent, or Firm* — Volentine & Whitt, PLLC

(57) ABSTRACT

In a non-volatile semiconductor memory device having a MONOS structure, a memory cell section for storing information, and a periphery circuitry section for writing and reading the information with respect to the memory cell section are formed in the surface region of a silicon substrate. A plurality of memory cells is formed in the memory cell section, while a plurality of periphery circuitry transistors are formed also in the periphery circuitry section. Since the periphery circuitry transistor has a structure wherein no electric charge accumulation layer exists, it is possible to prevent from electric charge injection to the periphery circuitry transistor, whereby hot carrier characteristics of the periphery circuitry transistor are improved.

12 Claims, 11 Drawing Sheets

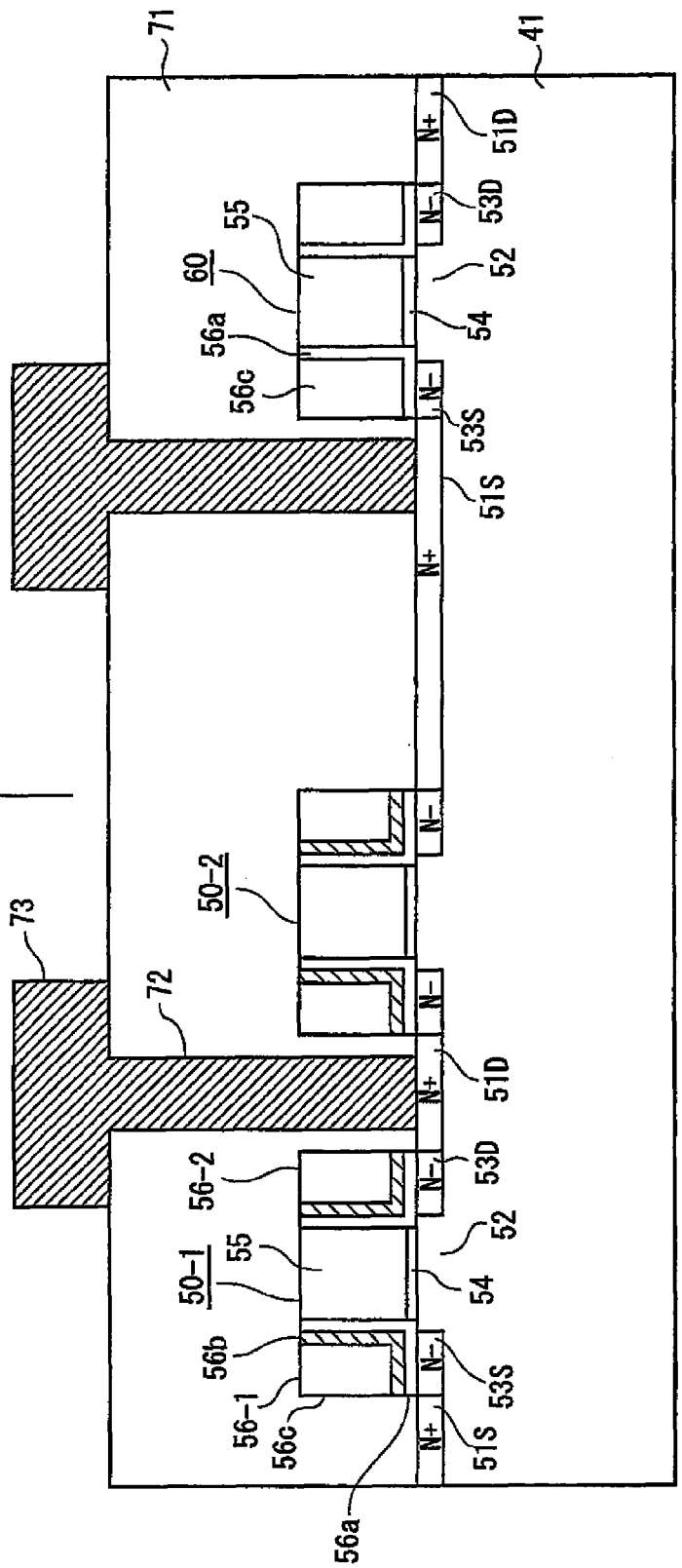
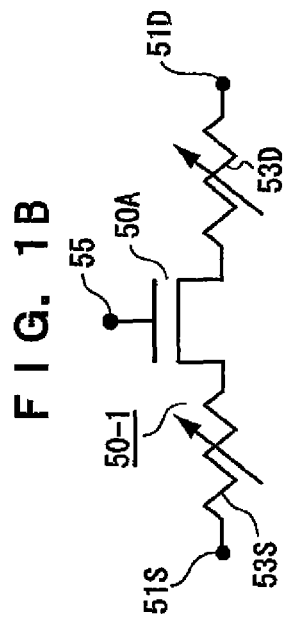
FIG. 1A
FIG. 1B

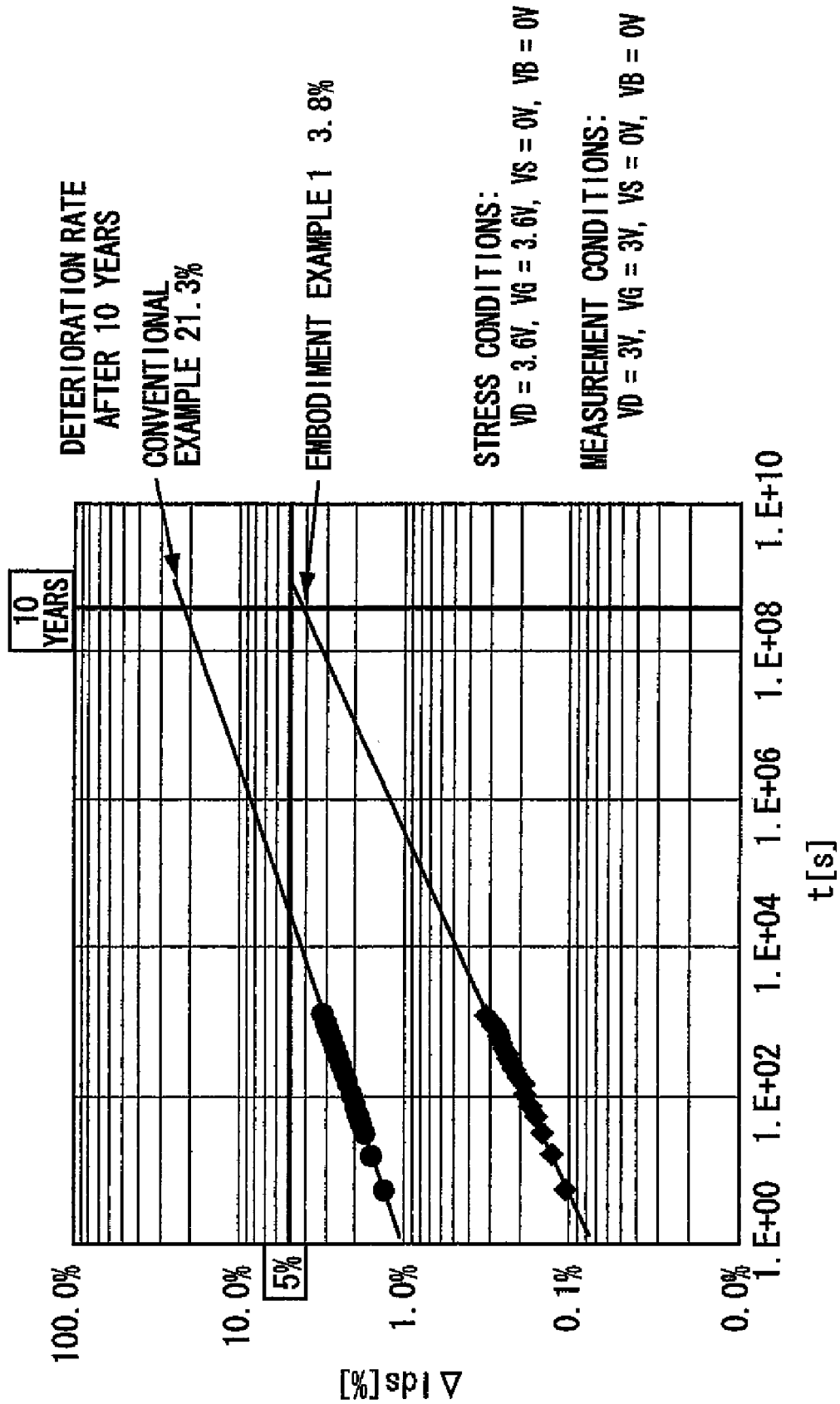

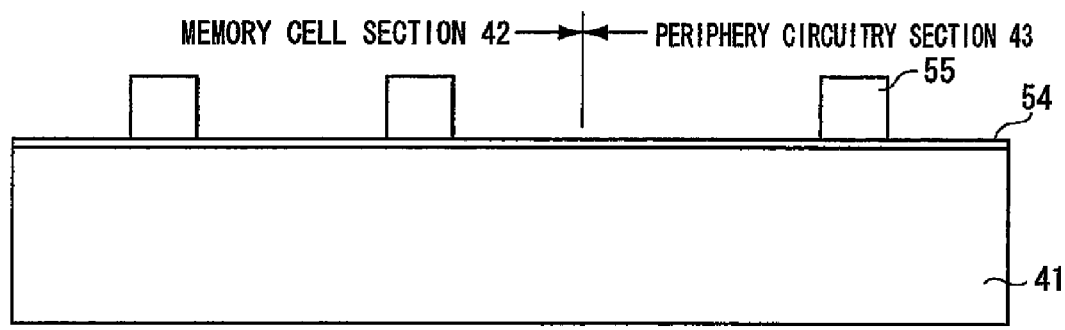
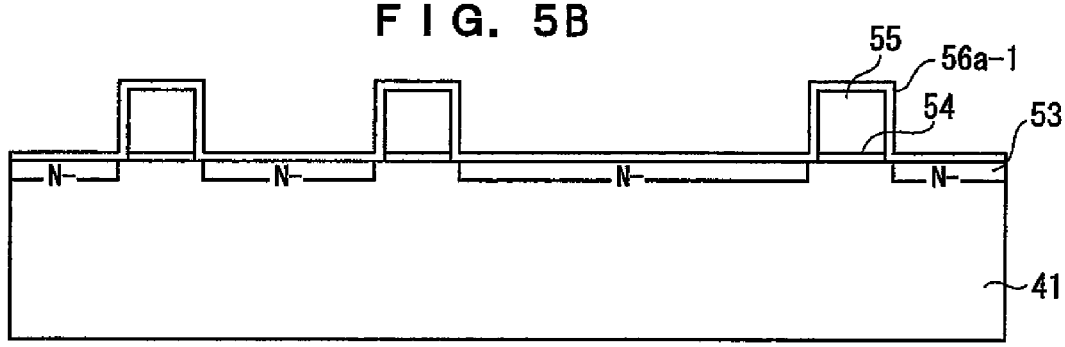
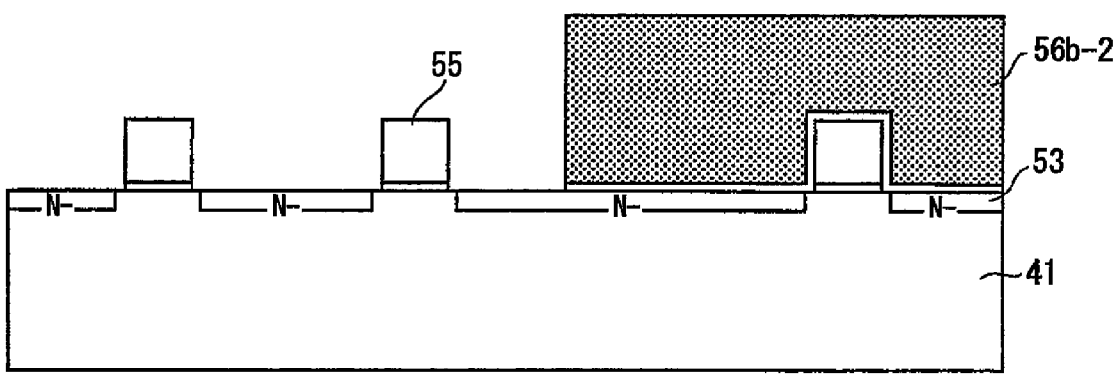
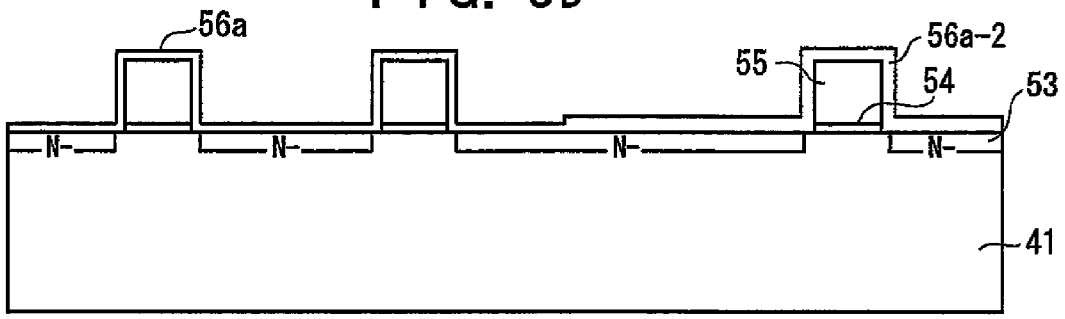

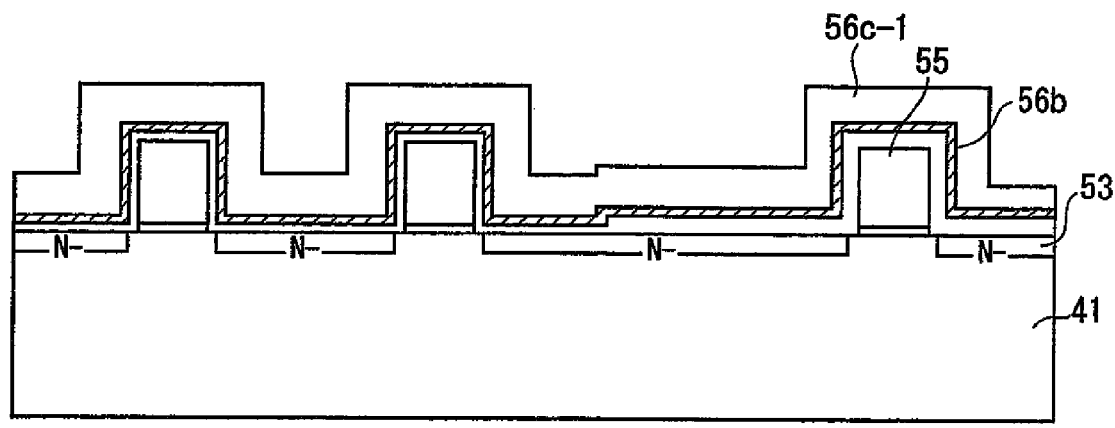
F I G. 5E
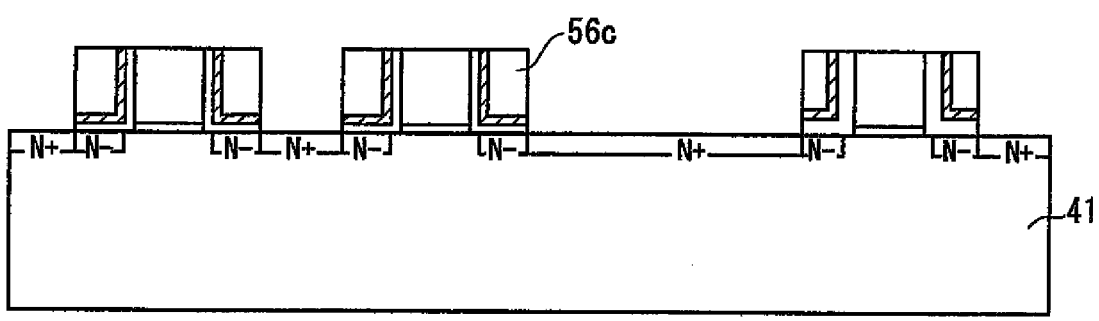
F I G. 5F
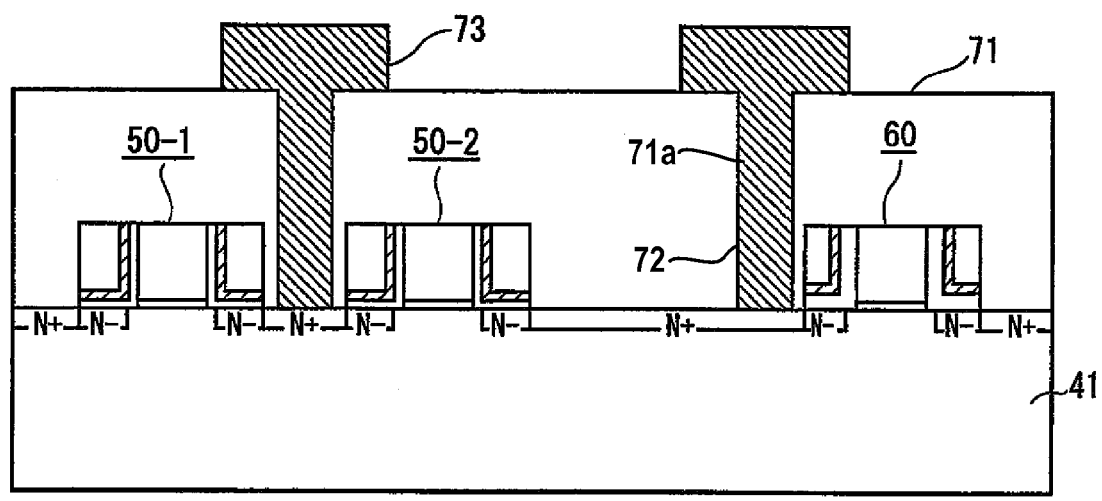
F I G. 5G

MEMORY CELL SECTION 42 — PERIPHERY CIRCUITRY SECTION 43

F I G. 7E
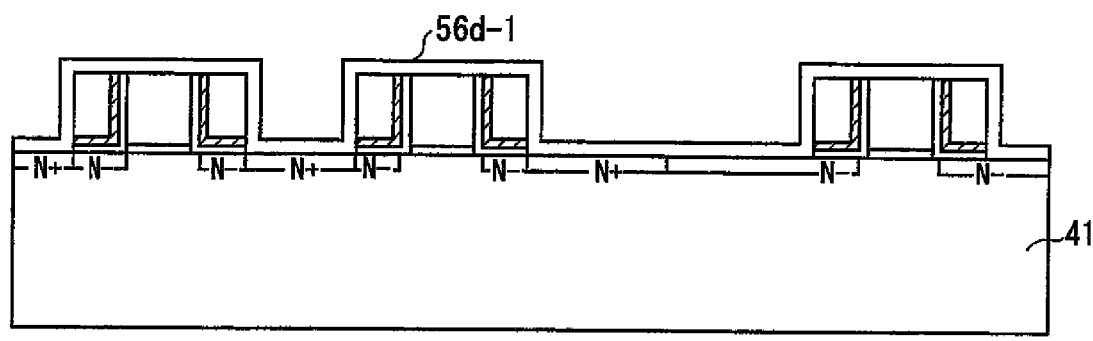
F I G. 7F
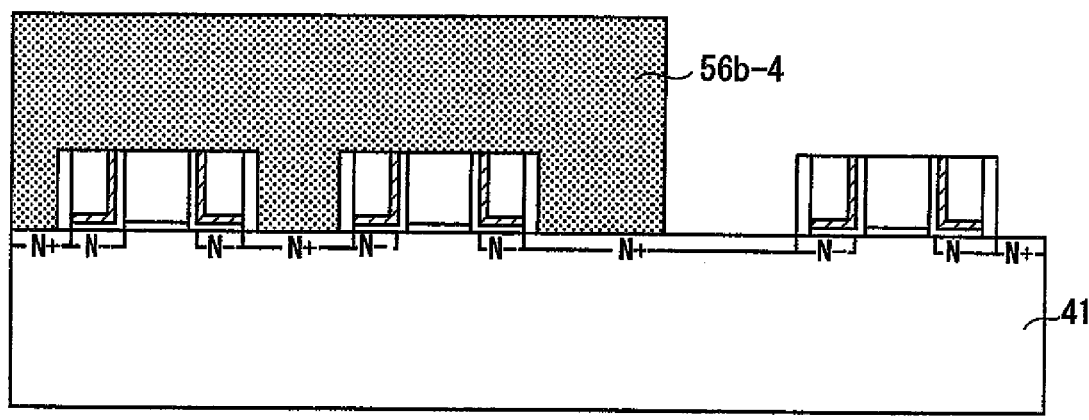
F I G. 7G
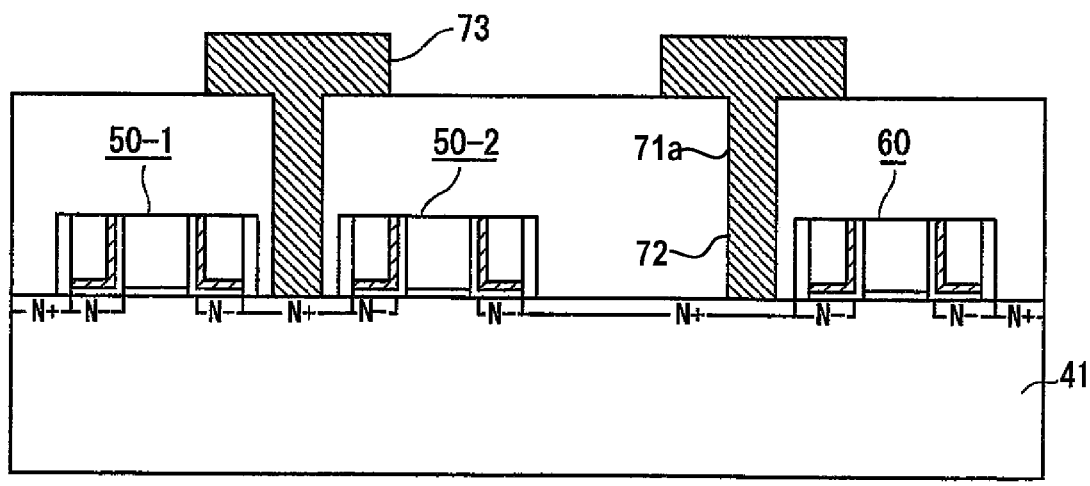

NON-VOLATILE SEMICONDUCTOR MEMORY DEVICE AND METHOD FOR MANUFACTURING THE SAME

CROSS-REFERENCE TO RELATED APPLICATION

This is a divisional application of application Ser. No. 11/585,798 filed on Oct. 25, 2006, now U.S. Pat. No. 7,608,887, which is hereby incorporated by reference in its entirety for all purposes.

This application claims priority under 35 U.S.C. 119 from Japanese Patent Application No. 2005-348838, the contents of which is incorporated by reference in its entirety.

BACKGROUND OF THE INVENTION

1. Field of the Invention

The present invention relates to a non-volatile semiconductor memory device having a MONOS (Metal-Oxide-Nitride-Oxide-Semiconductor) structure and the like, and a method for manufacturing the same.

2. Description of the Related Art

As a type of non-volatile semiconductor memory devices, the one having a MONOS structure is known.

In the MONOS structure, for example, an ONO film (3-layered film made of an oxide film being an oxidized film-insulating film—a nitride film—an oxide film) is provided between a substrate and a gate electrode. The ONO film can capture electric charges to store them by means of a large number of traps existing in the nitride film in the ONO film, so that when electric charges are taken in and out with respect to the traps, a non-volatile semiconductor memory device can be realized.

As ways for taking such electric charges in and out of the ONO film, there are ways of writing and erasing by taking electrons in and out of the whole surface under the gate electrode with tunneling currents, and ways using hot carriers. The former ways using tunneling currents may increase the number of times of rewriting, and high reliability can be assured. On the other hand, the latter ways of applying hot carriers enable reduction in the operating voltage for writing/erasing data, (whereby manufacturing costs can be reduced), besides enabling high-speed operations.

As a technology for such non-volatile semiconductor memory device having the MONOS structure, there is, for example, that described in Japanese Patent Application Laid-Open (JP-A) No. 2005-64295.

FIGS. 8A and 8B are schematic constitutional diagrams each showing a conventional non-volatile semiconductor memory device having the MONOS structure as described in JP-A No. 2005-64295 and the like wherein FIG. 8A is a schematic sectional view showing the non-volatile semiconductor memory device, and FIG. 8B is an equivalent circuit diagram showing the memory cell in FIG. 8A.

As shown in FIG. 8A, for example, in a P-type silicon substrate 1, a memory cell section 2 for storing information, and a peripheral circuitry section 3 for writing and reading information with respect to the memory cell section 2 are formed. In the memory cell section 2, a plurality of memory cells 10-1, 10-2 and the like are provided, while a plurality of peripheral circuitry transistors (e.g. N-channel type MOS transistor (hereinafter, referred to as "NMOS") 20 and the like are provided.

The memory cell 10-1 is consisted of a source region 11S made of a high concentration N type (N+ type) impurity layer 11 and a drain region 11D disposed with a predetermined interval, a channel formation region 12 positioned between the source region 11S and the drain region 11D, a source side N– type region 13S made of a low concentration N type (N– type) impurity layer 13 formed between the source region 11S and the channel formation region 12, a drain side N– type region 13D made of the N– type impurity layer 13 formed between the drain region 11D and the channel formation region 12, a gate electrode 15 formed through a gate oxide film 14 on the channel formation region 12, an electric charge accumulation section 16-1 formed on the Source side N– type region 13S and an electric charge accumulation section 16-2 formed on the drain side N– type region 13D.

Each of the electric charge accumulation sections 16-1 and 16-2 is composed of an ONO lamination insulating film having a tunneling oxide film 16a formed on the N– type regions 13S and 13D, the electric charge accumulation layer 16b made of a silicon nitride film formed on the tunneling oxide film 16a, and a NSG (Non-doped SiO2) film 16c formed on the electric charge accumulation layer 16b.

A periphery circuit NMOS 20 is consisted of the source region 11S and the drain region 11D made of the N+ type impurity layer 11 with a predetermined interval on a surface region of the silicon substrate 11S, the channel formation region 12 positioned between the source region 11S and the drain region 11D, and the gate electrode 15 formed on the channel formation region 12 through the gate oxide film 14. Since the NMOS 20 is manufactured in the same manufacturing process as that of the memory cell 10-1, 10-2 and the like, it involves the source side N– type region 13S between the source region 11S and the channel formation region 12, the drain side N– type region 13D formed between the drain region 11D and the channel formation region 12, the electric charge accumulation section 16-1 formed on the source side N– type region 13S, and the electric charge accumulation section 16-2 formed on the drain side N– type region 13D.

An NSG layer 31 is deposited on the memory cells 10-1, 10-2 and the like as well as on the NMOS 20 and the like. In the NSG layer 31, contact holes are provided at the positions corresponding to the source region 11S, the drain region 11D, the gate electrode 15 and the like, each of the contact holes is filled with tungsten (W) 32, and it is electrically connected with a metal wiring 33 on the NSG layer 31.

As shown in FIG. 8B, for example, an equivalent circuit of the memory cell 10-1 involves the NMOS 10A, the source thereof is connected to the source region 11S through a variable resistor of the source side N– type region 13S, while the drain thereof is connected to the drain region 11D through a variable register of the drain side N– type region 11D.

Operation examples (1) to (3) of the memory cell 10-1 will be described below.

In the operations, such a case where recording (writing or erasing) of information (logical value "1" or "0") and reading with respect to the drain region 11D side of the memory cell 10-1 will be explained as an example. In case of applying the same operation as that described above with respect to the source region 11S side, the same operation may be made by counterchanging power voltage between the source region 11S and the drain region 11D.

(1) Recording of Information (Writing)

An operation for writing information (the logical value "1" or "0") to the memory cell 10-1 is implemented according to, for example, the following manner. In this case, such a situation that the initial state is considered to be the one where no electric charge is accumulated in the electric charge accumulation sections 16-1 and 16-2 (corresponding to logical value "1"), and logical value "0" is written into the drain region 11D side as information will be described.

In the case when information of logical value "0" is written on the drain region 11D side, a positive voltage (+Vdw) is applied to the drain region 11D, another positive voltage (+Vgw) is applied to the gate electrode 15, and the source region 11S is made to be ground voltage. According to such writing condition as described above, electric field concentrates in the vicinities of the drain side N– type region 13D where an impurity concentration is lower than that of the drain region 11D. Accordingly, generation of hot electrons (which are also referred to as "high energy electrons") being hot carriers due to ionization by collision converges efficiently in the drain side N– type region 13D. As a result, the hot electrons are selectively injected into the electric charge accumulation section 16-2 from the drain side N– type region 13D over energy barrier of the tunneling oxide film 16a, whereby information can be written.

(2) Reading of Information

Operations for reading the information on the side of the drain region 11D are implemented according to the following manner.

A positive voltage (+Vsr) is applied to the source region 11S, another positive voltage (+Vgr) is applied to the gate electrode 15, and the drain region 11D connected to ground voltage. In the drain region 11D side where logical value "0" is written, since an electric charge (electrons) is accumulated in the electric charge accumulation section 16-2, an ohmic value (resistance) of the drain side N– type region 13D increases. Thus, such a situation where it is difficult for carriers to be supplied to the channel formation region 12 arises so that sufficient electric current stops flowing. On the other hand, in such a situation where the logical value "1" is maintained as it is, i.e. in the initial state, since no electric charge is accumulated in the electric charge accumulation section 16-2, the ohmic value on the drain side N–type region 13D does not vary. As a result, carriers are supplied to the channel formation region 12, whereby sufficient electric current flows. As described above, it can discriminate with certainty which of logical values of either logical value "1" or "0"is written by utilizing differences in values of the electric current flowing through the NMOS 10A.

(3) Recording (Erasing) of Information

Erasing of information on the drain region 11D side is conducted according to the following manner.

With respect to the drain region 11D side in which a logical value "0" is written, for example, ultraviolet radiation or heat treatment (including allowing standing under high temperature) may be applied for the purpose of neutralizing the electric charge accumulated in the electric charge accumulation section 16-2.

As described above, according to the memory cell 10-1, since it makes possible to concentrate electric charge in the vicinities of the N– type regions 13S and 13D where an impurity concentration is lower than that of the drain region 11S or the drain region 11D to which voltage is applied, it is possible to efficiently concentrate generation of electric charges being hot carriers in the N– type regions 13S and 13D. As a consequence, it is possible to selectively inject the electric charges from the N– type regions 13S and 13D to the electric charge accumulation sections 16-1, and 16-2. Electric charges are accumulated in the electric charge accumulation sections 16-1 and 16-2 to be maintained, whereby information (logical value "0" or "1") can be efficiently written.

On the other hand, reading of information can be made by utilizing differences in ohmic values of the N– type regions 13S and 13D which vary in response to the presence of the electric charges accumulated by the electric charge accumulation sections 16-1 and 16-2. In other words, when the electric charge accumulation sections 16-1 and 16-2 are charged as a result of writing of information, carriers are difficult to be supplied due to elevation of ohmic values of the N– type regions 13S and 13D so that an electric current flows insufficiently. On the contrary, when the electric charge accumulation sections 16-1 and 16-2 are not charged, ohmic values of the N– type regions 13S and 13D do not vary so that carriers are supplied, whereby a sufficient electric current flows. By applying the difference as mentioned above, the logical value "0" or "1" can be positively discriminated.

As described above, since a non-volatile semiconductor memory device can be realized by a simple structure of a combination of the N– type regions 13S and 13D contributing to efficient writing and reading of information with the electric charge accumulation sections 16-1 and 16-2 which can accumulate electric charges, reduction of the costs can be achieved.

In a conventional method for manufacturing such non-volatile semiconductor memory device, the memory cell section 2 and the periphery circuitry section 3 are manufactured in such a process that these sections 2 and 3 have the same structures for the sake of simplifying the manufacturing steps to reduce masks used for lithography technology and the number of the manufacturing steps therefor.

However, according to a conventional non-volatile semiconductor memory device and the manufacturing method therefor, when electric charges are injected to the memory cell section 2, electric charges are also injected to the periphery circuitry transistors, whereby the hot carrier characteristics become deteriorated, because the memory cell transistors (NMOS 10A) in the memory cell section 2 has the same structures as that of the periphery circuitry transistors (NMOS 20) in the periphery circuitry section 3. For instance, there has been such a problem that the electrons travelling from the source region 11S of the NMOS 20 in the periphery circuitry section 3 in the direction of the drain region 11D cause ionization by collision or avalanche multiplying due to a high electric field in the vicinity of the drain side N– type region 13D, whereby electron-hole pairs are produced. In this case, a part of the pairs of electron and hole (hot ones) is injected to the electric charge accumulation layer 16b on the gate electrode side wall through the tunneling oxide film 16a, and as a result, hot carrier characteristics become deteriorated.

SUMMARY OF THE INVENTION

The present inventions of first and second aspects provide a non-volatile semiconductor memory device comprising: a semiconductor substrate; a memory cell section provided with a plurality of memory cell transistors each having a first gate electrode on the semiconductor substrate, a first insulating film formed at a side wall of the first gate electrode and at the lower periphery to the side wall, and a first sidewall made of an insulating film formed at a side of the first insulating film; and a periphery circuitry section formed in the vicinity of the memory cell section and provided with a plurality of periphery circuitry transistors each having a second gate electrode, a second insulating film formed on a side wall of the second gate electrode and at the lower periphery to the side wall, and a second sidewall made of an insulating film formed at a side of the second insulating film; the periphery circuitry section controlling memory operations with respect to the memory cell section, wherein, in the memory cell section of the memory cell section and the periphery circuitry section, an electric charge accumulation layer made of an insulating film is formed on top of the first insulating film lower periphery and between the side face of the first insulating film and the first sidewall.

The present inventions of third and fifth aspects provide a non-volatile semiconductor memory device comprising: a semiconductor substrate; a memory cell section provided with a plurality of memory cell transistors each having a first gate electrode on the semiconductor substrate, a first insulating film formed at a side wall of the first gate electrode as well as at the lower periphery to the side wall, a first electric charge accumulation layer made of an insulating film formed on top of the first insulating film lower periphery and at the side of the first insulating film, and a first sidewall made of an insulating film formed at a side of the first electric charge accumulation layer; and a periphery circuitry section which is formed in the vicinity of the memory cell section and provided with a plurality of periphery circuitry transistors each having a second gate electrode, a second insulating film formed on a side wall of the second gate electrode and at the lower periphery to the side wall, a second electric charge accumulation layer made of an insulating layer formed on top of the second insulating film lower periphery and at the side of the second insulating film, and a second sidewall made of an insulating film formed at a side of the second insulating film, wherein a film thickness of the lower periphery in the second insulating film differs from that of the lower periphery in the first insulating film; the periphery circuitry section controlling memory operations with respect to the memory cell section.

The present inventions of third and fifth aspects provide a non-volatile semiconductor memory device comprising: a semiconductor substrate; a memory cell section provided with a plurality of memory cell transistors each having a first gate electrode on the semiconductor substrate, a first insulating film formed at a side wall of the first gate electrode as well as at the lower periphery to the side wall, a first electric charge accumulation layer made of an insulating film formed on top of the first insulating film lower periphery and at a side of the first insulating film, a first sidewall made of an insulating film formed at a side of the first electric charge accumulation layer, a first low concentration impurity layer formed under the lower periphery of the first insulating layer, and a first high concentration impurity layer formed at the outer border of the first low concentration impurity layer; and a periphery circuitry section formed in the vicinity of the memory cell section and provided with a plurality of periphery circuitry transistors each having a second gate electrode, a second insulating film formed on a side wall of the second gate electrode and at the lower periphery to the side wall, a second electric charge accumulation layer made of an insulating layer formed on top of the second insulating film lower periphery and at a side of the second insulating film, a second sidewall made of an insulating film formed at a side of the second insulating film, a second low concentration impurity layer formed under the lower periphery of the second insulating film and having a different width in the substrate surface direction from that of the first low concentration impurity layer, and a second high concentration impurity layer formed at the outer border of the second low concentration impurity layer; the periphery circuitry section controlling memory operations with respect to the memory cell section.

The inventions of seventh and eighth aspects provide a non-volatile semiconductor memory device comprising: a semiconductor substrate; a memory cell section provided with a plurality of memory cell transistors each having a first gate electrode on the semiconductor substrate, a first insulating film formed at a side wall of the first gate electrode as well as at the lower periphery to the side wall, a first electric charge accumulation layer made of an insulating film formed on the top of the first insulating film lower periphery and at a side of the first insulating film, a first sidewall made of an insulating film formed at a side of the first electric charge accumulation layer, and a first semiconductor impurity layer positioned under the lower periphery of the first insulating film and outside the lower periphery, and formed separated from the first gate electrode by a first distance; and a periphery circuitry section formed in the vicinity of the memory cell section and provided with a plurality of periphery circuitry transistors each having a second gate electrode, a second insulating film formed at a side wall of the second gate electrode as well as at the lower periphery to the side wall, a second electric charge accumulation layer made of an insulating layer formed on the top of the second insulating film lower periphery and at a side of the second insulating film, a second sidewall made of the insulating film formed at a side of the second insulating film, and a second semiconductor impurity layer positioned under the lower periphery of the second insulating film and outside the lower periphery, and formed separated from the second gate electrode by a second distance different from that of the first distance.

According to the inventions of first and second aspects, the memory cell transistor has a structure wherein an electric charge accumulation layer exists, while the periphery circuitry transistor has a structure wherein no electric charge accumulation layer exists. As a result, it is possible to prevent from electric charge injection to the periphery circuitry transistor, and thus, hot carrier characteristics of the periphery circuitry transistor are improved.

According to the inventions of third and fourth aspects, the memory cell transistor and the periphery circuit transistor are formed in such that film thicknesses of the lower periphery in the first and second insulating films positioned on the side walls of the gate electrodes of the memory cell transistor and the periphery circuit transistor are changed, so that it is possible to prevent from electric charge injection to the periphery circuitry transistor, and thus, hot carrier characteristics of the periphery circuitry transistor are improved.

According to the inventions of fifth through eighth aspects, such a structure that widths of low concentration impurity layers, or distances from the gate electrodes to semiconductor impurity layers (e.g. the high concentration impurity layer) in the memory cell transistors and the periphery circuitry transistors are changed, whereby no electric charge injection occurs to the periphery circuitry transistor is achieved. Accordingly, it is possible to prevent from electric charge injection to the periphery circuitry transistor, and thus, hot carrier characteristics of the periphery circuitry transistor are improved.

BRIEF DESCRIPTION OF THE DRAWINGS

Preferred exemplary embodiments of the present invention will be described in detail based on the following figures, wherein:

FIG. 1A is a schematic sectional diagram showing a non-volatile semiconductor memory device having a MONOS structure according to example 1 of the invention;

FIG. 1B is a diagram showing an equivalent circuit of the non-volatile semiconductor memory device having a MONOS structure according to the example 1 of the invention;

FIG. 3 is a graphical representation showing comparative data in hot carrier characteristics of the example 1 shown in FIGS. 1A and 1B, and a conventional one;

FIG. 5A is a manufacturing process diagram showing an example of the manufacturing method in the non-volatile semiconductor memory device of FIG. 4;

FIG. 5B is a manufacturing process diagram showing the example of the manufacturing method in the non-volatile semiconductor memory device of FIG. 4 wherein the process applied after the process of FIG. 5A is illustrated;

FIG. 5C is a manufacturing process diagram showing the example of the manufacturing method in the non-volatile semiconductor memory device of FIG. 4 wherein the process applied after the process of FIG. 5B is illustrated;

FIG. 5D is a manufacturing process diagram showing the example of the manufacturing method in the non-volatile semiconductor memory device of FIG. 4 wherein the process applied after the process of FIG. 5C is illustrated;

FIG. 5E is a manufacturing process diagram showing the example of the manufacturing method in the non-volatile semiconductor memory device of FIG. 4 wherein the process applied after the process of FIG. 5D is illustrated;

FIG. 5F is a manufacturing process diagram showing the example of the manufacturing method in the non-volatile semiconductor memory device of FIG. 4 wherein the process applied after the process of FIG. 5E is illustrated;

FIG. 5G is a manufacturing process diagram showing the example of the manufacturing method in the non-volatile semiconductor memory device of FIG. 4 wherein the process applied after the process of FIG. 5F is illustrated;

FIG. 7E is a manufacturing process diagram showing the example of the manufacturing method in the non-volatile semiconductor memory device of FIG. 6 wherein the process applied after the process of FIG. 7D is illustrated;

FIG. 7F is a manufacturing process diagram showing the example of the manufacturing method in the non-volatile semiconductor memory device of FIG. 6 wherein the process applied after the process of FIG. 7E is illustrated;

FIG. 7G is a manufacturing process diagram showing the example of the manufacturing method in the non-volatile semiconductor memory device of FIG. 6 wherein the process applied after the process of FIG. 7F is illustrated;

DETAILED DESCRIPTION OF THE INVENTION

Figure 2A:
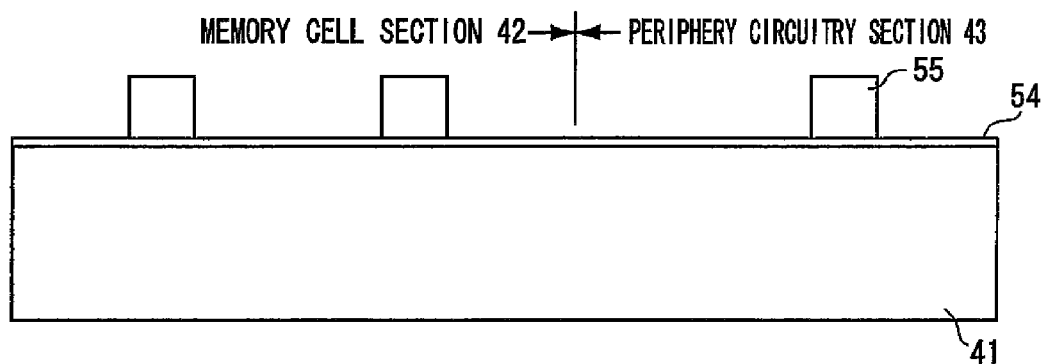
FIG. 2A is a manufacturing process diagram showing an example of the manufacturing method in the non-volatile semiconductor memory device of FIG. 1A.

A non-volatile semiconductor memory device has a memory cell section provided with a plurality of memory cell transistors, and a periphery circuitry section provided with a plurality of periphery circuitry transistors and for controlling memory operations with respect to the memory cell section.

The memory cell transistor has a first gate electrode, a first insulating film formed on the side wall of the first gate electrode and the lower periphery of the side wall, an electric charge accumulation layer made of an insulating film formed on the lower periphery of the first insulating film and the side of the first insulating film, and a first sidewall formed on the side of the electric charge accumulation layer.

The periphery circuit transistor is formed in the vicinity of the memory cell section and has a second gate electrode, a second insulating film formed on the side wall of the second gate electrode and in the lower periphery of the side wall, and a second sidewall formed on the side of the second insulating film.

EXAMPLE 1

Constitution Of Example 1

FIGS. 1A and 1B are schematic constitutional diagrams showing a non-volatile semiconductor memory device having a MONOS structure according to example 1 of the invention wherein FIG. 1A is a schematic sectional view thereof, while FIG. 1B is an equivalent circuit diagram of the memory cell shown in FIG. 1A.

As shown in FIG. 1A, in the non-volatile semiconductor memory device having the MONOS structure according to the example 1, a memory cell section 42 for storing information, and a periphery circuitry section 43 functioning to write or read the information with respect to the memory cell section 42 are formed, for example, in a surface region of a P-type silicon substrate 41. In the memory cell section 42, a plurality of memory cells 50-1, 50-2 and the like are formed; while a plurality of peripheral circuitry transistors (e.g. NMOS) 60 and the like are formed also in the periphery circuitry section 43.

A point in which the non-volatile semiconductor memory device of the example 1 differs essentially from a conventional semiconductor memory device is in that the non-volatile semiconductor memory device has such a structure that electric charge accumulation layers exist in memory cells 50-1, 50-2, and the like in the memory cell section 42, while no electric charge accumulation layer exists in the periphery circuitry transistor.

The respective memory cells 50-1, 50-2 and the like have the same constructions. For example, the memory cell 50-1 is consisted of a source region 51S and a drain region 51D made of a N+ type impurity layer 51 and which are formed on the surface region of a silicon substrate 41 with a predetermined interval, a channel formation region 52 positioned between the source region 51S and the drain region 51D, a source side N− type region 53S made of a N− type impurity layer 53 formed between the source region 51S and the channel formation region 52, a drain side N− type region 53D made of the N− type impurity layer 53 formed between the drain region 51D and the channel formation region 52, a gate electrode 55 made of polysilicon and the like formed on the channel formation region 52 through a gate insulating film (e.g. a gate oxide film) 54, an electric charge accumulation section 56-1 formed on the source side N− type region 53S, and an electric charge accumulation section 56-2 formed on the drain side N− type region 53D.

N− type regions 53S, 53D are regions for concentrating an electric field at peripheries of the N− type regions 53S and 53D in case of injecting selectively electric charges to the electric charge accumulation sections 56-1 and 56-2. As a result of providing these regions, generation of hot carriers can converge to the N− type regions 53S and 53D. Each of the electric charge accumulation sections 56-1 and 56-2 is composed of an ONO lamination insulating film having the tunneling oxide film 56a formed on the N− type regions 53S and 53D, the electric charge accumulation layer 56b made of the silicon nitride (SiN) formed on the tunneling oxide film 56a, and an insulating film (e.g. NSG film) 56c formed on the electric charge accumulation layer 56b.

The peripheral circuitry NMOS 60 is consisted of the source region 51S and the drain region 51D made of N+ type impurity layer 51 formed in a surface region of the silicon substrate 41 with a predetermined interval, the channel formation region 52 positioned between the source region 51S and the drain region 51D, the gate electrode 55 formed on the channel formation region 52 through the gate oxide film 54. Since the NMOS 60 is manufactured in accordance with substantially the same manner as that of the memory cells 50-1, 50-2 and the like, it involves the source side N− type region 53S formed between the source region 51S and the channel formation region 52, the drain side N− type region 53D formed between the drain region 51D and the channel formation region 52, and the tunneling oxide film 56a and the NSG film 56c formed on the N− type regions 53S and 53D, but the electric charge accumulation layer 56b is not provided.

On the memory cells 50-1, 50-2 and the like as well as on the NMOS 60 and the like, an insulating layer (e.g. an NSG layer) 71 is deposited. In the NSG layer 71, contact holes are provided at positions corresponding to the source region 51S, the drain region 51D, the gate electrode 55 and the like, and these contact holes are filled with, for example, tungsten (W) 72, whereby they are electrically connected with a metal wiring 73 on the NSG layer 71.

As shown in FIG. 1B, for example, the equivalent circuit of the memory cell 50-1 has the NMOS 50A wherein the source side is connected to the source region 51S through a variable register of the source side N− type region 53S, while the drain side of which is connected to the drain region 51D through a variable register of the drain side N− type region 53D.

In the memory cell 50-1, recording (writing) of information, reading of information, and recording (erasing) of information can be implemented as substantially the same as in a conventional case.

(Manufacturing Method of Example 1)

FIGS. 2A through 2F are manufacturing process diagrams each illustrating examples of the manufacturing method applied to the non-volatile semiconductor memory device of FIGS. 1A and 1B.

The non-volatile semiconductor memory device according to the example 1 is manufactured in accordance with, for example, the respective manufacturing processes illustrated in FIGS. 2A through 2F.

Manufacturing Process of FIG. 2A:

On the P-type silicon substrate 41, the gate oxide film ($SiO_2$) 54 is formed, and a polysilicon (Poly Si) film is deposited. On the polysilicon film, a resist film is formed, and a pattern of the gate electrode 55 is formed with the resist film by applying a lithography technology. The polysilicon film is etched by the use of the resist film which was pattern-formed as a mask in accordance with dry etching method to form the gate electrode 55. Thereafter, the resist is removed by ashing technology and wet washing.

Figure 2B:
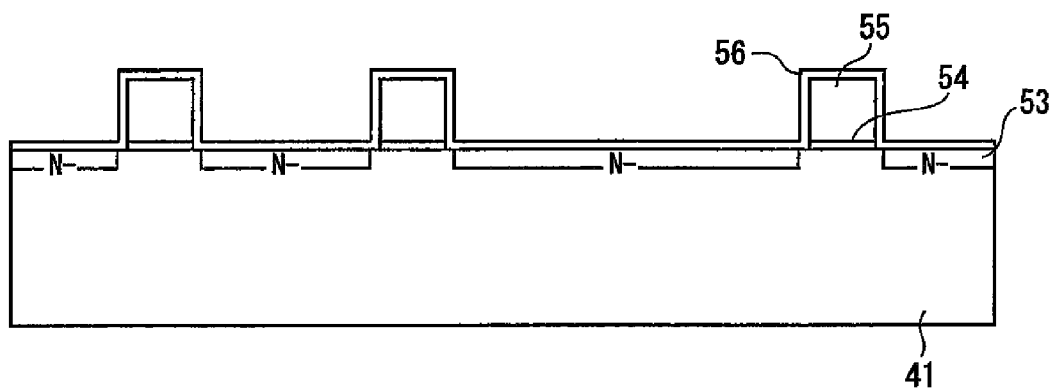
FIG. 2B is a manufacturing process diagram showing the example of the manufacturing method in the non-volatile semiconductor memory device of FIG. 1A wherein the process applied after the process of FIG. 2A is illustrated.

Manufacturing Process of FIG. 2B:

Using the gate electrode 55 as a mask, the gate oxide film 54 extending therearound is removed, and then, the tunneling oxide film 56a is formed by means of thermal oxidation method. Using the gate electrode 55 covered with the tunneling oxide film 56a as a mask, ions of N− type impurity are injected to the silicon substrate 41 in accordance with an ion implantation method (implantation method), whereby the N− type impurity layer 53 is formed. The injection condition is, for example, to inject around $1e^{13}$ (ions/cm$^2$) of arsenic (As).

Figure 2C:
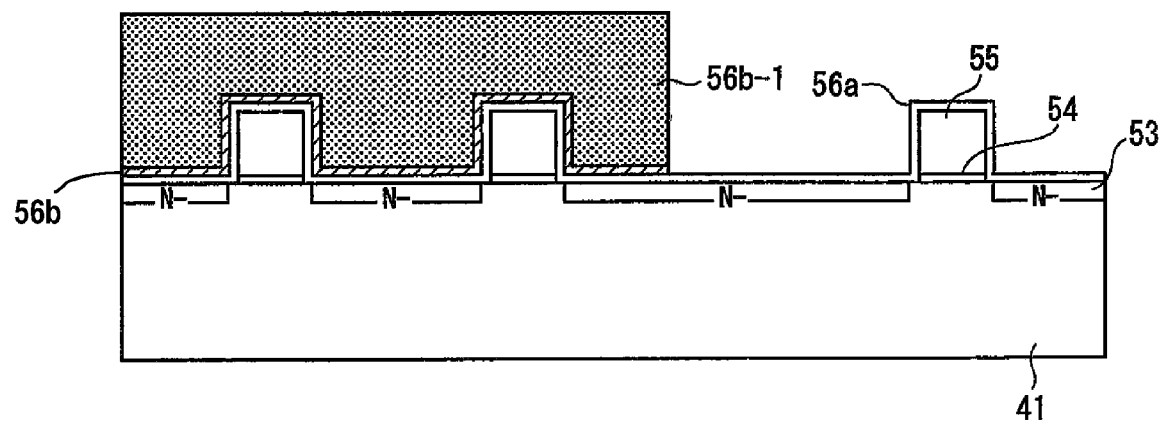
FIG. 2C is a manufacturing process diagram showing the example of the manufacturing method in the non-volatile semiconductor memory device of FIG. 1A wherein the process applied after the process of FIG. 2B is illustrated.

Manufacturing Process of FIG. 2C:

In accordance with CVD method, the silicon nitride film (SiN) 56b as the electric charge accumulation layer 56b is deposited on the whole surface. The resist film is formed on the whole surface, and a protection pattern 56b-1 of the resist film is formed on the memory cell section 42. Isotropic plasma etching technology (e.g. Chemical Dry Etching) is applied to remove the silicon nitride film 56b by using the protection pattern 56b-1 as the mask.

Figure 2D:
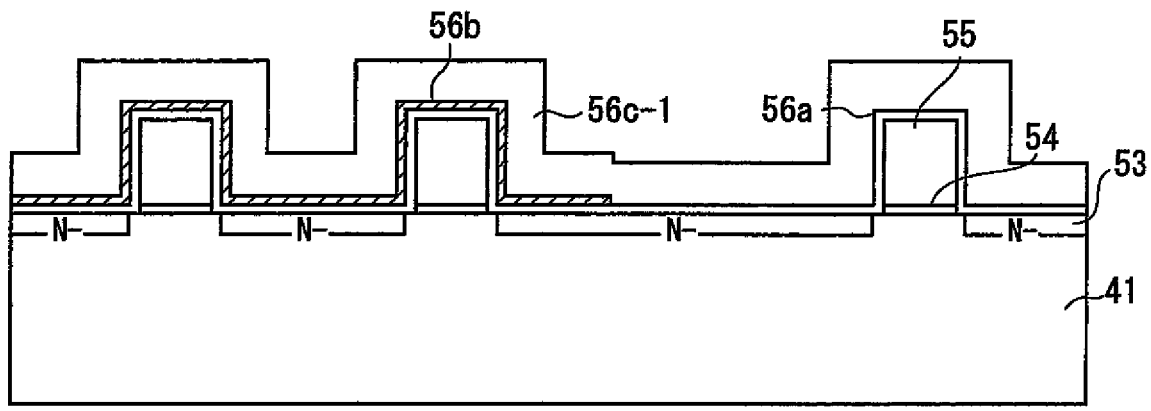
FIG. 2D is a manufacturing process diagram showing the example of the manufacturing method in the non-volatile semiconductor memory device of FIG. 1A wherein the process applied after the process of FIG. 2C is illustrated.

Manufacturing Process of FIG. 2D:

By means of ashing technology and wet washing, the protection pattern 56b-1 made of the resist film is removed. In accordance with CVD method, an NSG film 56c-1 is deposited on the whole surface.

Figure 2E:
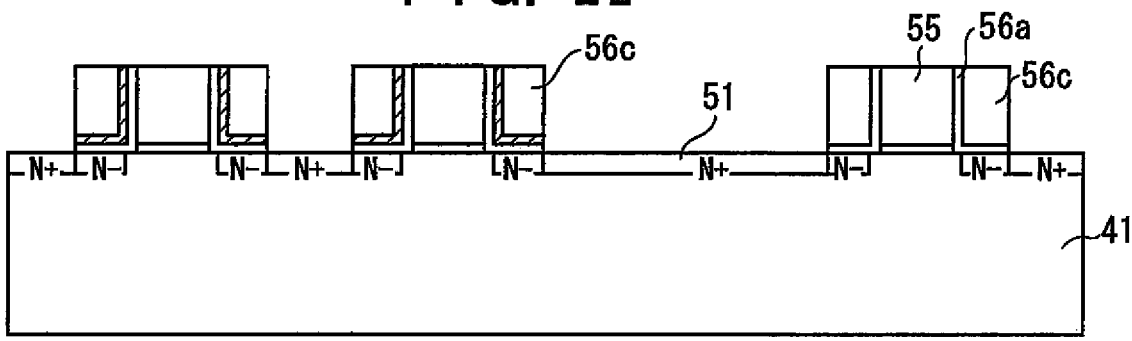
FIG. 2E is a manufacturing process diagram showing the example of the manufacturing method in the non-volatile semiconductor memory device of FIG. 1A wherein the process applied after the process of FIG. 2D is illustrated.

Manufacturing Process of FIG. 2E:

According to dry etching technology, the NSG film 56c-1 is whole surface-etched (etch-backed) to form the NSG film 56c of a sidewall (SW). Ions of N+type impurity are injected to the silicon substrate 41 by an ion implantation method by applying the gate electrode 55 and the NSG film 56c as the mask, whereby the N+type impurity layer 51 is formed. The injection condition is, for example, to inject around $1e^{15}$ (ions/cm$^2$) of arsenic (As).

Figure 2F:
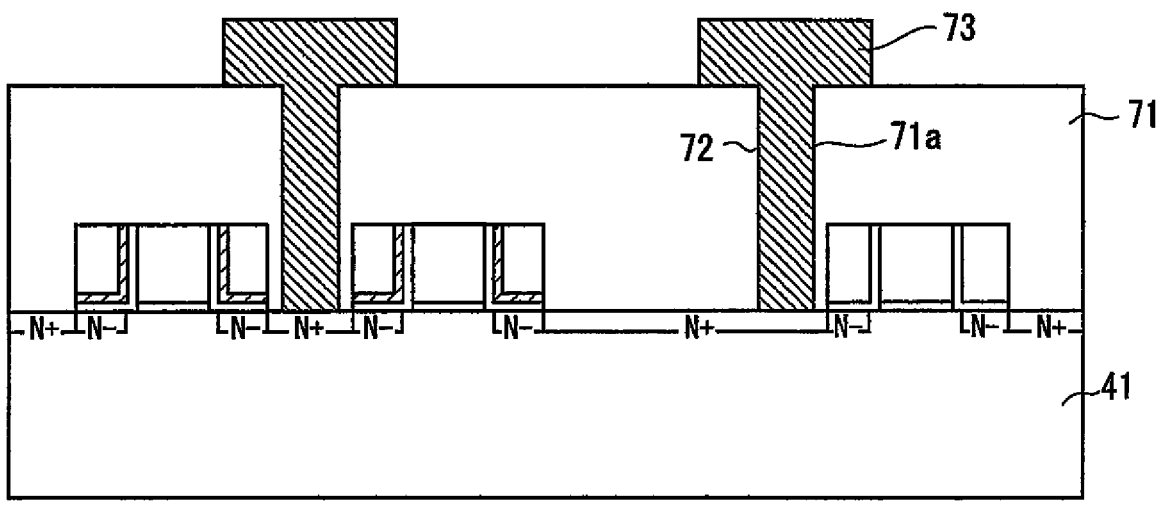
FIG. 2F is a manufacturing process diagram showing the example of the manufacturing method in the non-volatile semiconductor memory device of FIG. 1A wherein the process applied after the process of FIG. 2E is illustrated.

Manufacturing Process of FIG. 2F:

In accordance with CVD method, the NSG layer 71 is deposited on the whole surface. A resist film is formed, and a pattern of contact holes 71a is formed with the resist film by means of lithography technology. The NSG layer 71/the silicon nitride film 56b is etched in accordance with dry etching technology by applying the resist film which was pattern-formed as the mask, whereby a pattern formation of the contact holes 71a is made. Thereafter, the resist is removed by means of ashing technology and wet washing. According to CVD method, tungsten (W)/titanium nitride (TiN) is deposited. The contact holes 71a are embedded with tungsten 72 in accordance with CMP (Chemical Mechanical Polishing) method or etch-backing method.

Aluminum/titanium nitride for wiring is deposited in accordance with a sputtering method. A resist film is formed, and pattern formation of metal wiring 73 is made by using lithographic technology. By dry etching technology, metal etching of the aluminum/titanium nitride is carried out, whereby pattern formation of the metal wiring 73 is conducted. Thereafter, when the resist film is removed and the like by means of ashing technology and wet washing, the manufacturing processes are completed.

(Advantageous Effects of Examples)

According to the example 1, the following advantages (A) and (B) are obtained.

(A) The memory cells 50-1 and 50-2 or the like have such a structure that the electric charge accumulation layer 56b exists, while the periphery circuitry transistor (the NMOS 60 and the like) have such a structure that no electric charge accumulation layer 56b exists, so that it is possible to prevent from injection of electric charge to the peripheral circuitry transistor, whereby hot carrier characteristics of the periphery circuitry transistor are improved.

(B) FIG. 3 is a graphical representation indicating the comparative data in hot carrier characteristics of the example 1 of FIGS. 1A and 1B and a conventional one wherein the numbers on the abscissa of the graph indicate the time (e.g. 10 seconds are represented exponentially by 1.0E+1, and 100 seconds are represented by 1.0E+2), and the numbers on the ordinate indicate the amounts of drain/source current due to leakage. In the stress condition, the drain voltage VD=3.6V, the gate voltage VG=3.6V, the source voltage VS=0V, and the substrate voltage VB =0V, while in the measurement condition, the drain voltage VD=3V, the gate voltage VG=3V, and the source voltage VS=0V.

When the substrate voltage VB=0V, it is found that hot carrier characteristics are more improved on the basis of the application of the example 1 than that of a conventional example.

EXAMPLE 2

Figure 4:
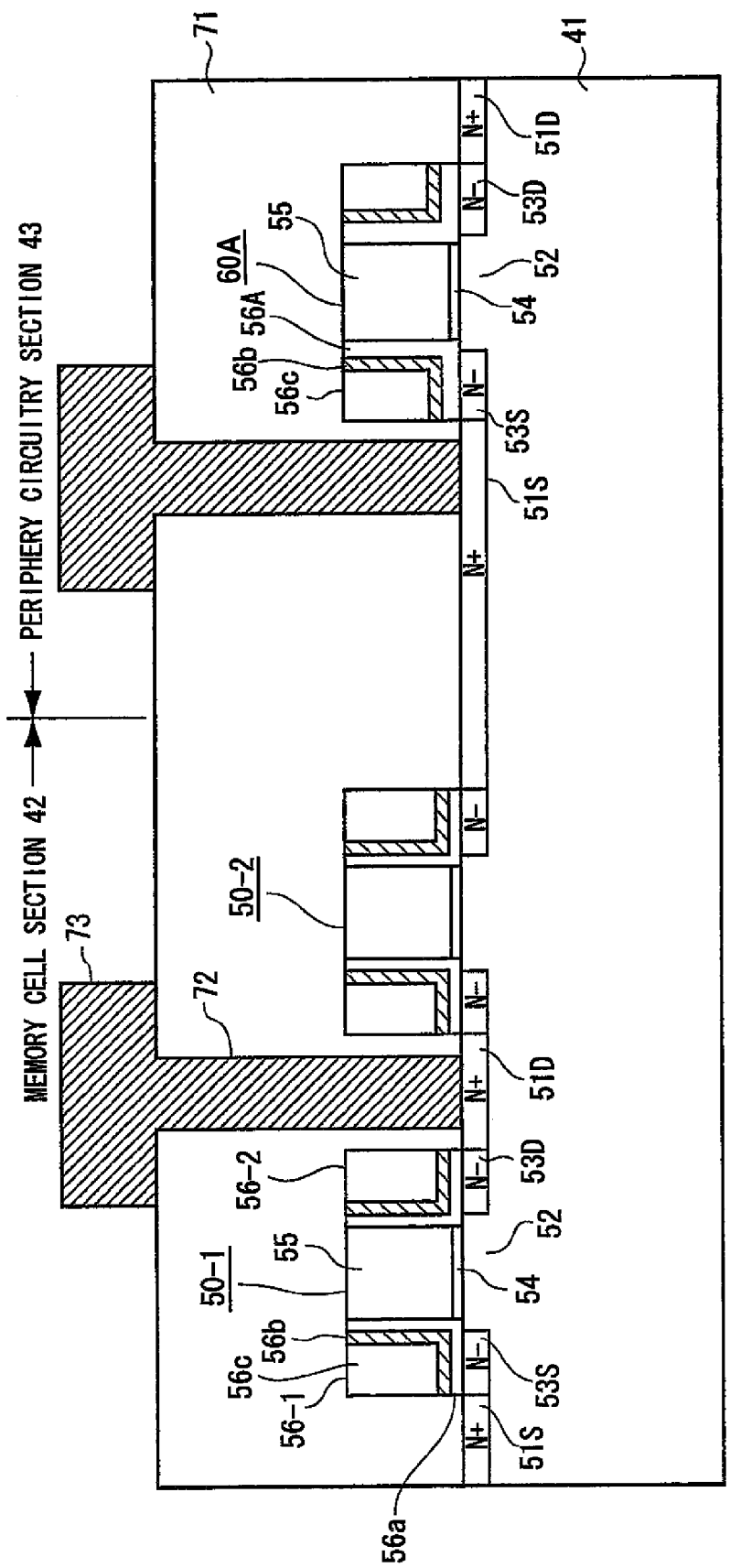
FIG. 4 is a schematic sectional view showing a non-volatile semiconductor memory device having a MONOS structure according to example 2 of the invention.

FIG. 4 is a schematic sectional diagram showing a non-volatile semiconductor memory device having a MONOS structure according to the example 2 of the invention wherein the same components as that in FIGS. 1A and 1B, according to the example 1, are designated by the same reference characters as that in FIGS. 1A and 1B.

In the non-volatile semiconductor memory device having the MONOS structure according to the example 2, a memory cell section 42 for storing information, and a periphery circuitry section 43 functioning to write or read the information with respect to the memory cell section 42 are formed, as in the case of example 1, in a surface region of a P-type silicon substrate 41. In the memory cell section 42, a plurality of memory cells 50-1, 50-2 and the like are formed, while a plurality of peripheral circuitry transistors (e.g. NMOS) 60A and the like are formed also in the periphery circuitry section 43.

The non-volatile semiconductor memory device of the example 2 differs from that of the example 1 in that film thicknesses of tunneling oxide films 56a and 56A existing under an electric charge accumulation layer 56b of a sidewall spacer made of an NSG film 56c positioned on a side wall of a gate electrode 55 of the memory cells 50-1, 50-2 and the like as well as a periphery circuitry transistor (e.g. an NMOS 60A) are changed, whereby such a structure that no electric charge injection occurs upon the periphery circuitry transistors is achieved. In other words, the film thickness of the tunneling oxide film 56A existing under the electric charge accumulation layer 56b on the side of the periphery circuitry transistor (e.g. NMOS 60A) is larger as compared with that of the tunneling oxide film 56a existing under the electric charge accumulation layer 56b on the side of the memory cells 50-1, 50-2 and the like, whereby electric charge injection is suppressed.

The reason why the above-described processing should be taken is as follows. In the periphery circuitry NMOS 60A, for example, when electrons are intended to inject to the electric charge accumulation layer 56b, the fusion is not achieved so far as the tunneling oxide film 56A existing under the electric charge accumulation layer 56b is tunneled (transmits the tunneling oxide film 56A in the form of tunneling current) by using the (hot) electrons produced in the vicinity of the tunneling oxide film 56A existing under the electric charge accumulation layer 56b. The tunneling current is indicated by Fowler-Noldheime electric current, and it depends on the exponential function with respect to a film thickness of the tunneling oxide film 56A. For this reason, when a film thickness of the tunneling oxide film 56A is thickened, the tunneling current decreases all of a sudden because electrons are difficult to inject to the electric charge accumulation layer.

The other constitution is the same as that of example 1.

(Manufacturing Method in Example 2)

FIGS. 5A through 5G are manufacturing process diagrams each showing the example of the manufacturing method in the non-volatile semiconductor memory device of FIG. 4 wherein the same components as that in FIGS. 2A through 2F illustrating the manufacturing processes of example 1 are designated by the same reference characters as that in FIGS. 2A through 2F.

The non-volatile semiconductor memory device of the example 2 is manufactured in accordance with, for example, the manufacturing processes illustrated in FIGS. 5A through 5G.

Manufacturing Process of FIG. 5A:

As in the case of example 1, the gate oxide film 54 is formed on the P-type silicon substrate 41, and a polysilicon film is deposited. On the polysilicon film, a resist film is formed, and a pattern of the gate electrode 55 is formed with the resist film by applying a lithography technology. The polysilicon film is etched by the use of the resist film which was pattern-formed as a mask by dry etching method to form the gate electrode 55. Thereafter, the resist is removed by ashing technology and wet washing.

Manufacturing Process of FIG. 5B:

The gate electrode 55 is used as the mask, and the gate oxide film 54 extending therearound is removed, and then, a first tunneling oxide film 56a-1 is formed by means of thermal oxidation method. The gate electrode 55 covered with the first tunneling oxide film 56a-1 is used as the mask, ions of N− type impurity are injected to the silicon substrate 41 in accordance with ion implantation method, whereby the N− type impurity layer 53 is formed. The injection condition is, for example, to inject around $1e^{13}$ (ions/cm$^2$) of arsenic.

Manufacturing Process of FIG. 5C:

A resist film is formed on the whole surface, and a protection pattern 56b-2 made of the resist film covering the periphery circuitry section 43 is formed by the use of lithography technology. The first tunneling oxide film 56a-1 of the memory cell section 42 is removed in accordance with a wet etching technology by applying the protection pattern 56b-2 as the mask.

Manufacturing Process of FIG. 5D:

By means of ashing technology and wet washing, a protection pattern 56b-2 made of the resist film is removed. By utilizing a thermal oxidation method, a second tunneling oxide film 56a is formed on the whole surface. In the area of the periphery circuitry section 43, the addition of the tunneling oxide film 56a on tunneling oxide film 56a-1 results in a thicker tunneling oxide film 56a-2.

Manufacturing Process of FIG. 5E:

After depositing the SiN film 56b by utilizing CVD method, an NSG film 56c-1 is deposited by CVD method.

Manufacturing Process of FIG. 5F:

According to dry etching technology, the NSG film 56c-1 is subjected to overall etching to form the NSG film 56c of a sidewall is formed. Ions of N+ type impurity are injected to the silicon substrate 41 by utilizing an ion implantation method by applying the gate electrode 55 and the NSG film 56c as the mask, whereby the N+ type impurity layer 51 is formed. The injection condition is, for example, to inject around $1e^{15}$ (ions/cm$^2$) of arsenic.

Manufacturing Process of FIG. 5G:

As in substantially the same case of example 1, by CVD method, the NSG layer 71 is deposited on the whole surface. A resist film is formed, and a pattern of contact holes 71a is formed on the NSG layer 71 by means of lithography technology. By means of dry etching technology, the NSG layer 71 is etched, whereby a pattern formation of the contact holes 71a is made. Then, the resist film is removed by means of ashing technology and wet washing. By CVD method, tungsten/titanium nitride is deposited. The contact holes 71a are embedded with tungsten 72 by CMP method or etch-backing method.

Aluminum/titanium nitride for wiring is deposited by a sputtering method. A resist film is formed, and a pattern formation of a metal wiring 73 is made by lithography technology. By dry etching technology, metal etching of the aluminum/titanium nitride is carried out whereby a pattern formation of the metal wiring 73 is conducted. Thereafter, when the resist film is removed and the like operations are carried out, the manufacturing processes are completed.

(Advantageous Effects of Example 2)

According to the example 2, when the non-volatile semiconductor memory device of the invention is formed by changing film thicknesses of the memory cells 50-1, 50-2 and the like as well as the tunneling oxide films 56a and 56A existing under the electric charge accumulation layer 56b of a sidewall spacer made of the NSG film 56c positioned on a side wall of the gate electrode 55 of the periphery circuitry transistors (e.g. the NMOS 60A), electric charge injection to the periphery circuitry transistors can be prevented, so that hot carrier characteristics of the periphery circuitry transistors are improved.

EXAMPLE 3

Constitution of Example 3

Figure 6:
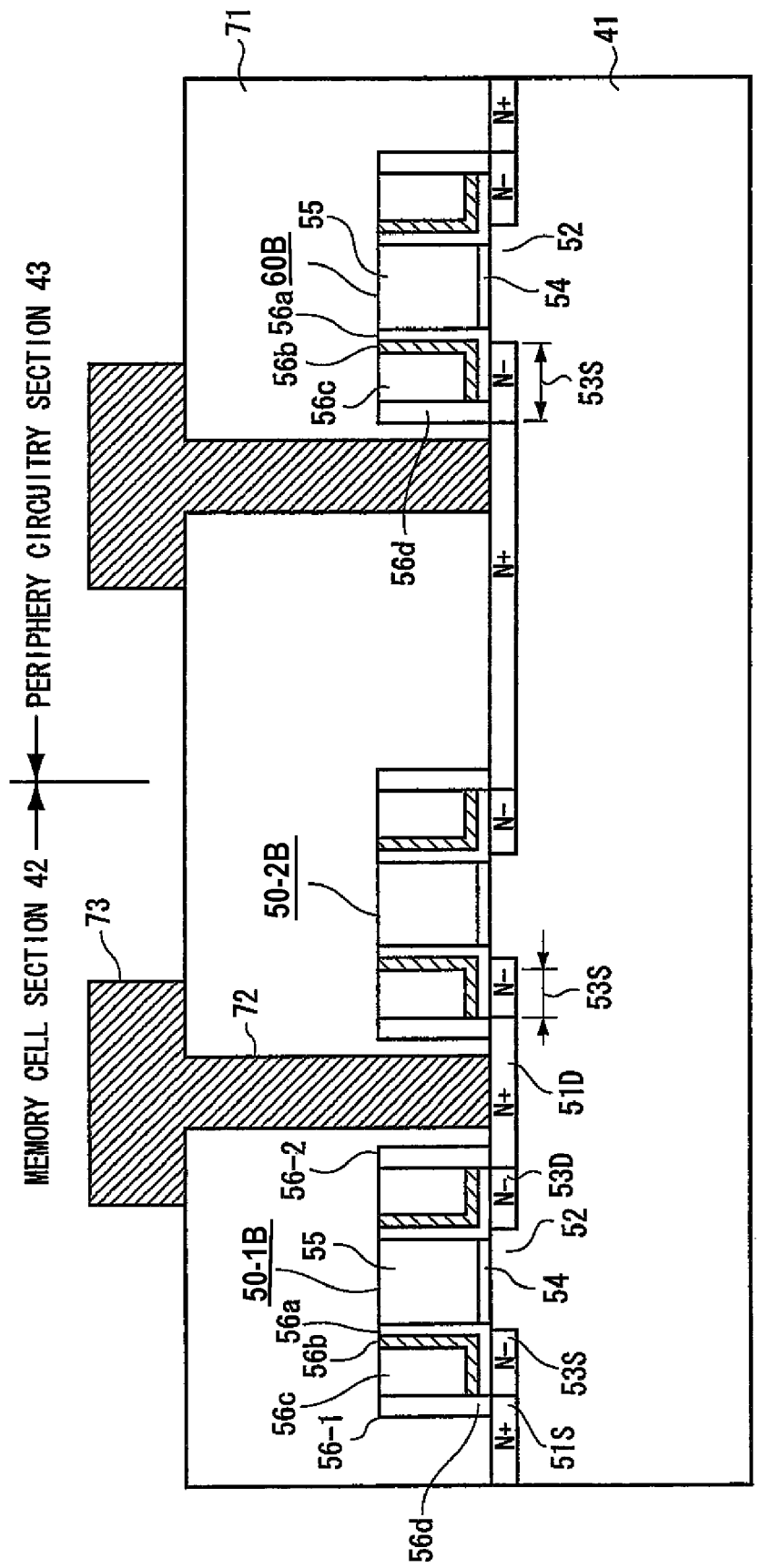
FIG. 6 is a schematic sectional view showing a non-volatile semiconductor memory device having a MONOS structure according to example 3 of the invention.

FIG. 6 is a schematic sectional diagram showing a non-volatile semiconductor memory device having a MONOS structure according to the example 3 of the invention wherein the same components as that in FIGS. 1A and 1B according to the example 1 are designated by the same reference characters as that in FIGS. 1A and 1B.

In the non-volatile semiconductor memory device having the MONOS structure according to the example 3, a memory cell section 42 for storing information, and a periphery circuitry section 43 functioning to write or read the information with respect to the memory cell section 42 are formed, as in the case of example 1, in a surface region of a P-type silicon substrate 41. In the memory cell section 42, a plurality of memory cells 50-1B, 50-2B and the like are formed, while a plurality of peripheral circuitry transistors (e.g. NMOS) 60B and the like are formed also in the periphery circuitry section 43.

The non-volatile semiconductor memory device of the example 1 differs from that of the example 1 in that a sidewall made of the NSG film 56d is formed on the memory cells 50-1B, 50-2B and the like as well as on side walls of the electric charge accumulation sections 56-1 and 56-2 of the periphery circuitry transistors (e.g. NMOS 60B), so that dimensions of the memory cells 50-1B, 50-2B, . . . and the N− type regions 53S and 53D of the peripheral circuitry NMOS 60B are changed, whereby such a structure that no electric charge injection occurs upon the periphery circuitry NMOS 60B is achieved. In other words, widths of the N− type regions 53S and 53D on the side of the periphery circuitry NMOS 60B are increased as compared with the widths of the N− type regions 53S and 53D on the side of the memory cells 50-1B, 50-2B and the like, whereby electric charge injection are suppressed with respect to the periphery circuitry NMOS 60B.

The reason why the above-described width arrangement is made is in that the N− type regions 53S and 53D are provided for decreasing the electric field in the vicinity of the drain, and when the widths of the N− type regions 53S and 53D are increased, the electric field in the vicinity of the drain decreases. When the electric field in the vicinity of the drain decreases, and a generation ratio of hot electrons or positive holes decreases, whereby an injection ratio of electrons on the electric charge accumulation layer 56b decreases so that hot carrier characteristics are improved.

The other constitution is the same as that of example 1.

(Manufacturing Method in Example 3)

FIGS. 7A through 7G are manufacturing process diagrams each showing the example of the manufacturing method for the non-volatile semiconductor memory device of FIG. 6 wherein the same components as that in FIGS. 2A through 2F illustrating the manufacturing processes of example 1 are designated by the same reference characters as that in FIGS. 2A through 2F.

The non-volatile semiconductor memory device of the example 3 is manufactured in accordance with, for example, the manufacturing processes illustrated in FIGS. 7A through 7G.

Figure 7A:
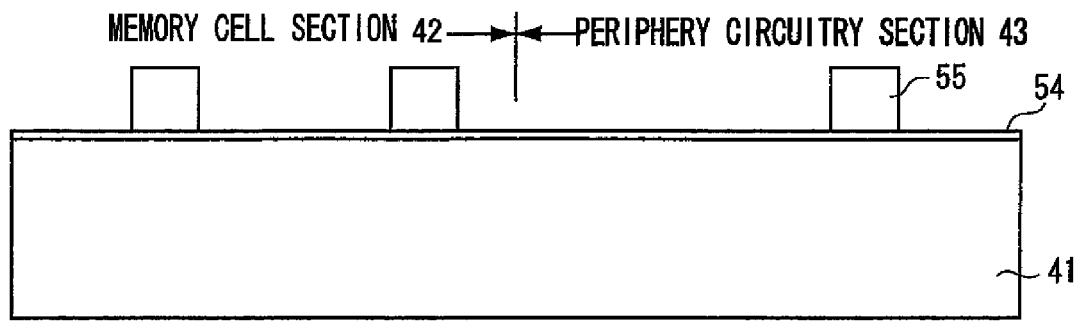
FIG. 7A is a manufacturing process diagram showing an example of the manufacturing method in the non-volatile semiconductor memory device of FIG. 6.

Manufacturing Process of FIG. 7A:

As in the case of example 1, the gate oxide film 54 is formed on the P-type silicon substrate 41, and a polysilicon film is deposited. On the polysilicon film, a resist film is formed, and a pattern of the gate electrode 55 is formed with the resist film by applying a lithography technology. The polysilicon film is etched by the use of the resist which was pattern-formed as a mask by dry etching method to form the gate electrode 55. Thereafter, the resist is removed by ashing technology and wet washing.

Figure 7B:
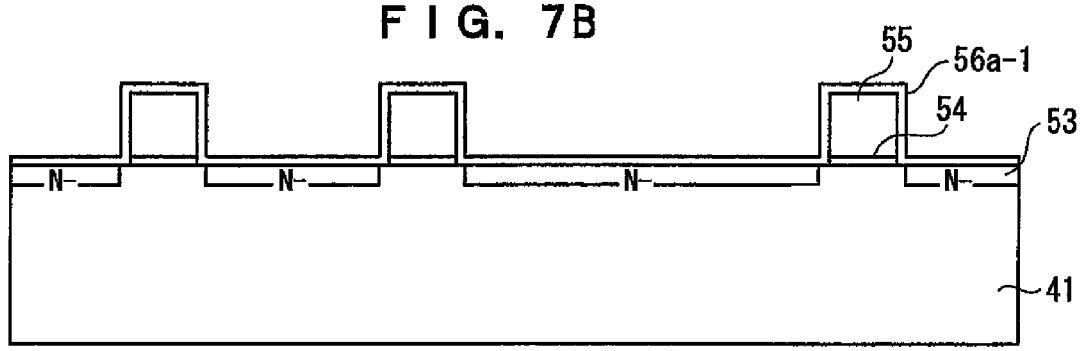
FIG. 7B is a manufacturing process diagram showing the example of the manufacturing method in the non-volatile semiconductor memory device of FIG. 6 wherein the process applied after the process of FIG. 7A is illustrated.

Manufacturing Process of FIG. 7B:

As in the case of example 1, the gate electrode 55 is used as the mask, and the gate oxide film 54 extending therearound is removed, and then, a tunneling oxide film 56a-1 is formed by means of thermal oxidation method. The gate electrode 55 covered with the tunneling oxide film 56a-1 is used as the mask, ions of N− type impurity are injected to the silicon substrate 41 by an ion implantation method, whereby the N− type impurity layer 53 is formed. The injection condition is, for example, to inject around $1e^{13}$ (ions/cm$^2$) of arsenic.

Figure 7C:
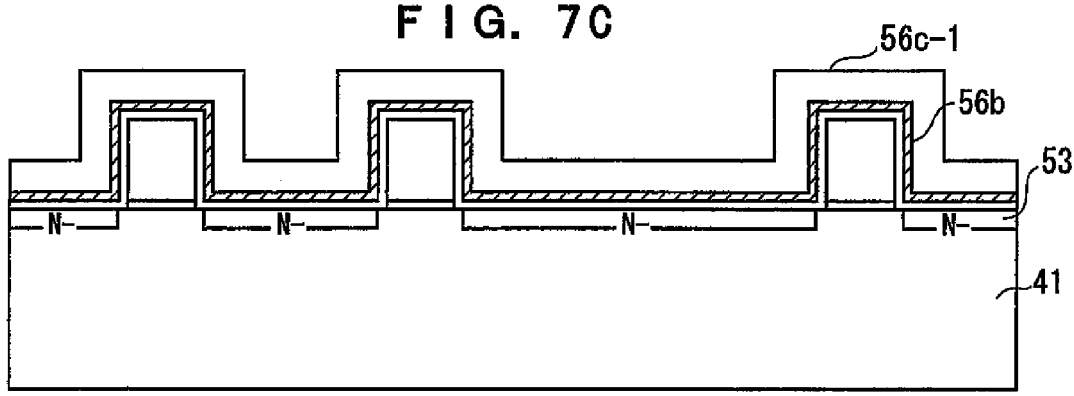
FIG. 7C is a manufacturing process diagram showing the example of the manufacturing method in the non-volatile semiconductor memory device of FIG. 6 wherein the process applied after the process of FIG. 7B is illustrated.

Manufacturing Process of FIG. 7C:

After depositing the silicon nitride film 56*b* in accordance with CVD method, an NSG film 56*c*-1 is deposited in accordance with CVD method.

Figure 7D:
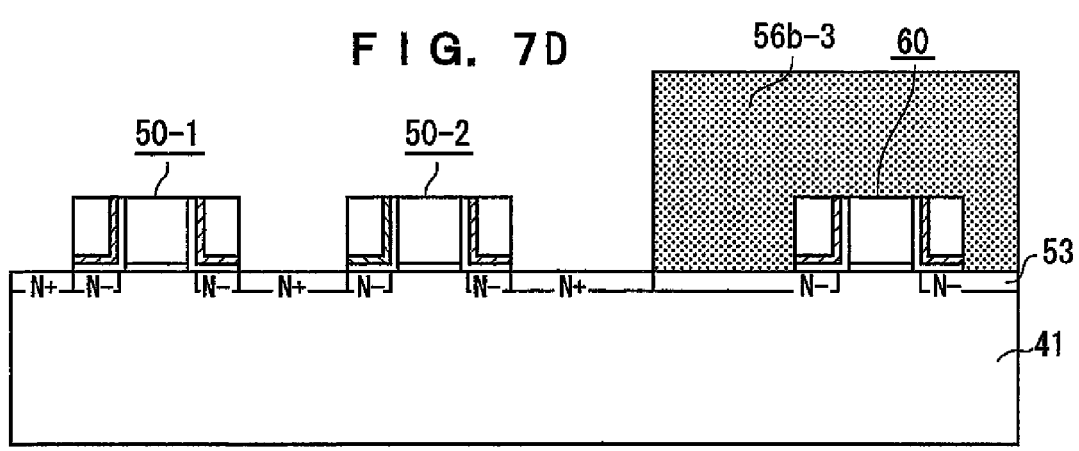
FIG. 7D is a manufacturing process diagram showing the example of the manufacturing method in the non-volatile semiconductor memory device of FIG. 6 wherein the process applied after the process of FIG. 7C is illustrated.
Figure 8A:
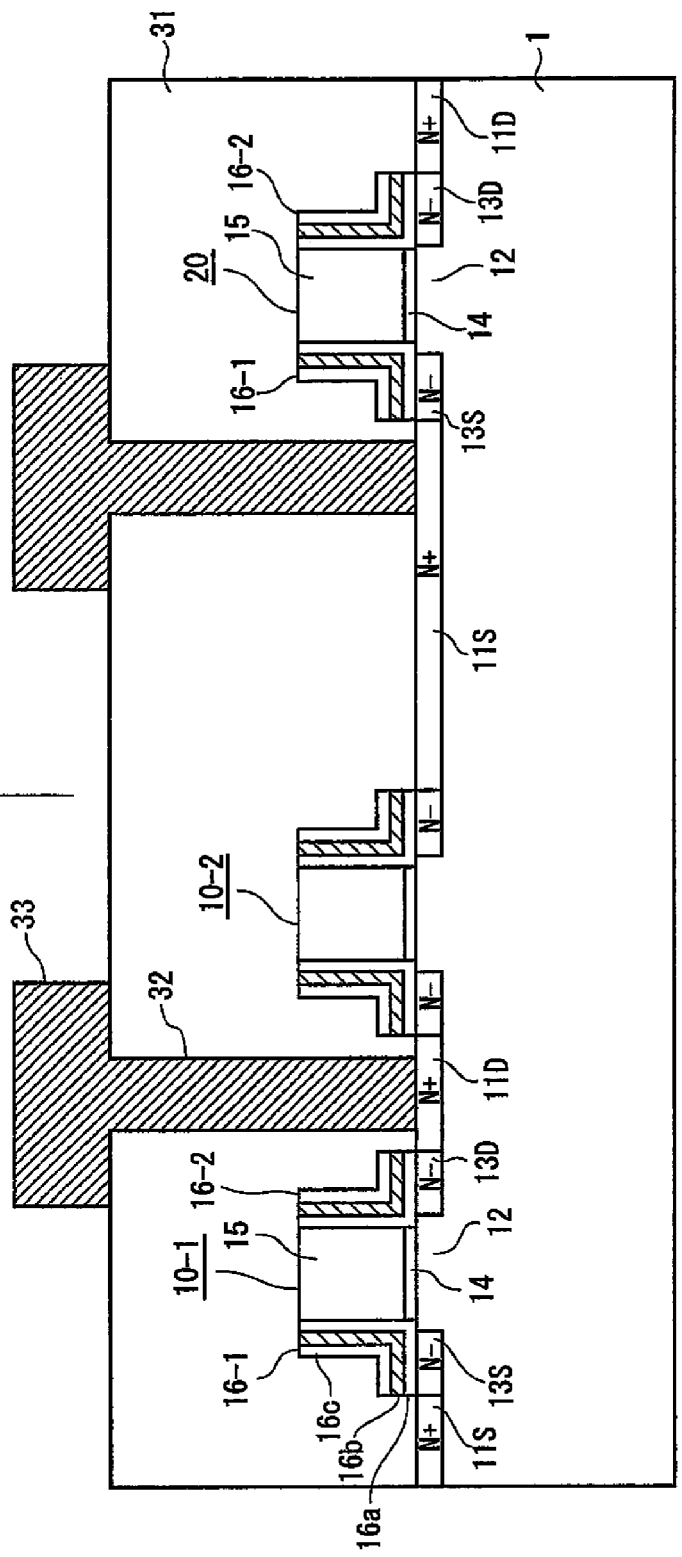
FIG. 8A is a schematic sectional view showing a conventional non-volatile semiconductor memory device having a MONOS structure.
Figure 8B:
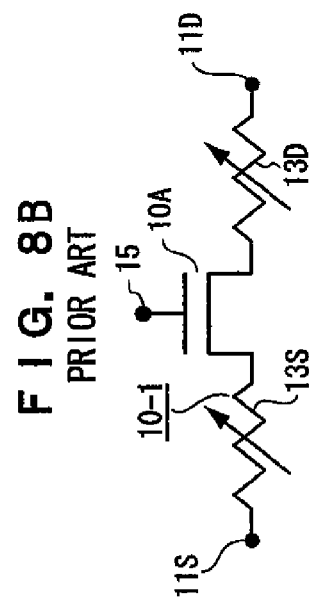
FIG. 8B is a diagram showing an equivalent circuit of the conventional non-volatile semiconductor device of FIG. 8A having the MONOS structure.

Manufacturing Process of FIG. 7D:

By dry etching technology, the NSG film 56*c*-1 is subjected to overall etching to perform a sidewall formation, whereby the electric charge accumulation sections 56-1 and 56-2 are formed on both the side walls of the gate electrode 55. A resist film is formed; a protection pattern 56*b*-3 of the periphery circuitry section 43 is formed by the use of lithography technology. The gate electrode 55, the electric charge accumulation sections 56-1, 56-2, and the protection pattern 56*a*-1 are applied as the mask, and N+ type impurity ions are injected to the silicon substrate 41 by means of ion implantation method, whereby the source region 51S and the drain region 51D made of the N+ type impurity layer 51 are formed. The injection condition of the ions is, for example, to inject around $1e^{15}$ (ions/cm$^2$) of arsenic.

Manufacturing Process of FIG. 7E:

The resist film is removed by means of ashing technology and wet washing. By CVD method, the NSG film 56*d*-1 is deposited.

Manufacturing Process of FIG. 7F:

By dry etching technology, the NSG film 56*d*-1 is subjected to overall etching to make a sidewall formation, whereby the NSG film 56*d* is formed on the side walls of the electric charge accumulation sections 56-1 and 56-2. A resist film is formed; a protection pattern 56*b*-4 is formed by the use of lithography technology. The gate electrode 55 of the periphery circuitry section 43, the electric charge accumulation sections 56-1, 56-2, and the protection pattern 56*a*-4 are applied as the mask, and N+ type impurity ions are injected to the silicon substrate 41 by means of ion implantation method, whereby the source region 51S and the drain region 51D made of the N+ type impurity layer 51 are formed on the periphery circuitry section 43. The injection condition of the ions is, for example, to inject around $1e^{15}$ (ions/cm$^2$) of arsenic. The protection pattern 56*a*-4 made of the resist film is removed by means of ashing technology and wet washing.

Manufacturing Process of FIG. 7G:

Substantially the same as in the case of example 1, by CVD method, the NSG layer 71 is deposited on the whole surface. A resist film is formed, and a pattern of contact holes 71*a* is formed on the NSG layer 71 by means of lithography technology. The NSG layer 71 is etched by dry etching technology, whereby a pattern formation of the contact holes 71*a* is made. Then, the resist film is removed by means of ashing technology and wet washing. By CVD method, tungsten/titanium nitride is deposited. The contact holes 71*a* are embedded with tungsten 72 in accordance with CMP method or etch-backing method.

Aluminum/titanium nitride for wiring is deposited by a sputtering method. A resist film is formed; and a pattern formation of a metal wiring 73 is made by lithography technology. By dry etching technology, metal etching of the aluminum/titanium nitride is carried out, whereby a pattern formation of the metal wiring 73 is conducted. Thereafter, when the resist film is removed and the like operations are carried out, the manufacturing processes are completed.

(Advantageous Effects of Example 3)

According to the example 3, the following advantages (A) and (B) are obtained.

(A) When the non-volatile semiconductor memory device of the invention is formed so as to have such a structure that there is no electric charge injection to the periphery circuitry NMOS 60B by changing dimensions of the memory cells 50-1B, 50-2B and the like as well as the N− type regions 53S and 53D of the periphery circuitry NMOS 60B, electric charge injection to the periphery circuitry transistors can be prevented, so that hot carrier characteristics of the periphery circuitry transistors are improved.

(B) In the non-volatile semiconductor memory device of FIG. 6, the source side N− type region 53S or the drain side N− type region 53D may be omitted. In the device as described above, when a distance from the gate electrode 55 to the source region 51S/drain region 51D is changed to obtain such a structure that there is no electric charge injection to the periphery circuitry transistors, the electric charge injection with respect to the periphery circuitry transistors can be prevented and hot carrier characteristics of the periphery circuitry transistors are improved.

It is to be noted that the invention is not limited to the above-described examples 1 to 3, but sectional structures, constitutional materials of the non-volatile semiconductor memory device, or the manufacturing processes therefor and the like may be variously modified.

What is claimed is:

1. A method for manufacturing a non-volatile semiconductor memory device comprising:
    (a) forming a first gate electrode of a memory cell transistor and a second gate electrode of a periphery circuitry transistor on a substrate;
    (b) injecting low concentration impurity ions to the substrate using the first gate electrode and the second gate electrode as a mask;
    (c) forming an electric charge accumulation layer made of an insulating layer in a region containing the first and second gate electrodes and forming a protection pattern covering the first gate electrode and the electric charge accumulation layer;
    (d) etching to remove the electric charge accumulation layer at the second gate electrode using the protection pattern as a mask;
    (e) forming a sidewall made of an insulating film on the first gate electrode and the second gate electrode after removing the protection pattern; and
    (f) injecting high concentration impurity ions to the substrate using the first gate electrode, the second gate electrode, and the sidewall as a mask.

2. The method for manufacturing a non-volatile semiconductor memory device as described in claim 1, wherein:
    the protection pattern is composed of a photoresist film; and the formation of the protection pattern is made by patterning the photoresist so as to apply the photoresist film, and to cover only the first gate electrode by means of lithography.

3. The method for manufacturing a non-volatile semiconductor memory device as described in claim 1, wherein:
    the formation of the sidewall is made by depositing an insulating film and etching back the insulating film.

4. A method for manufacturing a non-volatile semiconductor memory device comprising:
    (a) forming a first gate electrode of a memory cell transistor and a second gate electrode of a periphery circuitry transistor on a substrate;
    (b) injecting low concentration impurity ions to the substrate using the first gate electrode and the second gate electrode as a mask;
    (c) forming a first insulating film at a side wall of the first gate electrode and at a lower periphery to the side wall of the first gate electrode, and further forming a second insulating film having a different thickness from that of the first insulating film at a side wall of the second gate electrode and at a lower periphery to the side wall of the second gate electrode;

(d) forming an electric charge accumulation layer made of an insulating layer on the lower periphery of the first insulation film and at a side of the first insulating film as well as on top of the lower periphery of the second insulation film and at a side of the second insulating film, and further forming a sidewall made of an insulating film at a side of the electric charge accumulation layer; and (e) injecting high concentration impurity ions to the substrate using the first gate electrode and the second gate electrode as a mask.

5. The method for manufacturing a non-volatile semiconductor memory device as described in claim 4, wherein:
the formation of the sidewall is made by depositing an insulating film and etching back the insulating film.

6. The method for manufacturing a non-volatile semiconductor memory device as described in claim 4, wherein:
the film thickness of the second insulating layer is greater than that of the first insulating layer.

7. A method for manufacturing a non-volatile semiconductor memory device comprising:

(a) forming a first gate electrode of a memory cell transistor and a second gate electrode of a periphery circuitry transistor on a substrate;

(b) injecting low concentration impurity ions to the substrate using the first gate electrode and the second gate electrode as a mask to form a low concentration impurity layer;

(c) forming a first insulating film at a side wall of the first gate electrode and at a lower periphery to the side wall of the first gate electrode, and further forming a second insulating film on a side wall of the second gate electrode and at a lower periphery to the side wall of the second gate electrode;

(d) forming an electric charge accumulation layer made of an insulating layer on the lower periphery of the first insulation film and at a side of the first insulating film as well as on top of the lower periphery of the second insulation film and at a side of the second insulating film, and further forming a sidewall made of an insulating film at a side of the electric charge accumulation layer; and (e) injecting high concentration impurity ions to the substrate using the first gate electrode and the second gate electrode as a mask to form a high concentration impurity layer, and setting a width in a substrate surface direction of the low concentration impurity layer under the memory cell transistor to be different from a width of the low concentration impurity layer under the periphery circuitry transistor by the high concentration impurity layer.

8. The method for manufacturing a non-volatile semiconductor memory device as described in claim 7, wherein:
the formation of the sidewall is made by depositing an insulating film and etching back the insulating film.

9. A method for manufacturing a non-volatile semiconductor memory device comprising:

(a) forming a first gate electrode of a memory cell transistor and a second gate electrode of a periphery circuitry transistor on a substrate;

(b) forming a first insulating film at a side wall of the first gate electrode and at a lower periphery to the side wall of the first gate electrode, and further forming a second insulating film at a side wall of the second gate electrode and at a lower periphery to the side wall of the second gate electrode;

(c) forming an electric charge accumulation layer made of an insulating layer on the lower periphery of the first insulating film and at a side of the first insulating film as well as on top of the lower periphery of the second insulating film and at a side of the second insulating film, and further forming a sidewall made of an insulating film at the side of the electric charge accumulation layer;

(d) injecting low concentration impurity ions to the substrate using the first gate electrode and the second gate electrode as a mask to form low concentration semiconductor impurity layers; and (e) injecting high concentration impurity ions to the substrate using the first and second gate electrodes and the sidewall at the periphery circuitry transistor to form high concentration impurity layers at a position separated from the first gate electrode by a first distance and at another position separated from the second gate electrode by a second distance different from the first distance.

10. The method for manufacturing a non-volatile semiconductor memory device as described in claim 9, wherein:
the formation of the sidewall is made by depositing an insulating film and etching back the insulating film.

11. The method for manufacturing a non-volatile semiconductor memory device as described in claim 7, wherein the width of the low concentration impurity layer under the periphery circuitry transistor is greater than the width of the low concentration impurity layer under the memory transistor.

12. The method for manufacturing a non-volatile semiconductor memory device as described in claim 9, wherein the first distance is greater than the second distance.

* * * * *